(12) United States Patent
Ishinaga

(10) Patent No.: US 6,593,598 B2
(45) Date of Patent: Jul. 15, 2003

(54) CHIP-TYPE LIGHT-EMITTING DEVICE WITH CASE

(75) Inventor: Hiroki Ishinaga, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/913,203
(22) PCT Filed: Dec. 4, 2000
(86) PCT No.: PCT/JP00/08591
§ 371 (c)(1), (2), (4) Date: Aug. 9, 2001
(87) PCT Pub. No.: WO01/45180
PCT Pub. Date: Jun. 21, 2001

(65) Prior Publication Data
US 2002/0134988 A1 Sep. 26, 2002

(30) Foreign Application Priority Data
Dec. 17, 1999 (JP) ............................................. 11-359511

(51) Int. Cl.[7] ............................................. H01L 33/00
(52) U.S. Cl. ............................. 257/98; 257/99; 257/100
(58) Field of Search ........................... 257/98, 99, 100; 362/296, 362, 363, 364, 365, 368, 800

(56) References Cited

U.S. PATENT DOCUMENTS

| 5,698,866 | A | * | 12/1997 | Doiron et al. | 257/99 |
| 5,804,488 | A | * | 9/1998 | Shih et al. | 438/253 |
| 5,994,223 | A | * | 11/1999 | Kim | 438/694 |
| 6,080,615 | A | * | 6/2000 | Lee et al. | 438/239 |
| 6,355,946 | B1 | * | 3/2002 | Ishinaga | 257/98 |

FOREIGN PATENT DOCUMENTS

| JP | 06-17259 | * | 3/1994 |
| JP | 8-314395 | * | 11/1996 |

* cited by examiner

Primary Examiner—Minh Loan Tran
Assistant Examiner—Tan Tran
(74) Attorney, Agent, or Firm—Gerald T. Bodner

(57) ABSTRACT

A chip-type light-emitting device with case (10) includes an LED chip (12) which is bonded onto electrodes (16a, 16b) formed on a substrate (14). A case (20) is arranged such that the LED chip 12 is surrounded by a hole (22). The hole has an inner wall (22a) tapering downward shaped like a frustum of a cone, in which transparent resin is filled as a sealant. When cured, the transparent resin hardens and shrinks, and therefore, a gap (26) is formed between the inner wall and the transparent resin (sealant).

3 Claims, 2 Drawing Sheets

CHIP-TYPE LIGHT-EMITTING DEVICE WITH CASE

TECHNICAL FIELD

The present invention relates to a chip-type light-emitting device with case. More specifically, the present invention relates to a chip-type light-emitting device with case, in which an LED chip is bonded onto a substrate formed with electrodes on its surface, and the LED chip on the substrate is surrounded by a case having an inner wall of a hole shaped like a frustum of a cone, and a transparent resin is filled in the inner wall as a sealant.

PRIOR ART

One example of such a kind of chip-type light-emitting device with case is disclosed in, for example, Japanese Patent Laying-open No. 11-2207178 [H01L 33/00] laid-open on Aug. 10, 1999. As shown in FIG. 4, this semiconductor light-emitting device 1 includes a second white substrate 2, and an LED element 3 is stored in a concave portion 2a formed on the white substrate 2. In addition, the LED element 3 is die-bonded onto a first white substrate 4. Furthermore, the LED element 3 is entirely covered and sealed by a light-transmissible synthetic resin molding portion 5 filled in the concave portion 2a. In the semiconductor light-emitting device 1, a light-emitting efficiency was improved by emitting a light to a light-emitting surface by reflecting it on the first white substrate 4 and the second white substrate 2, even if the light is outputted from the LED element 3 to a side surface direction and a bottom surface direction opposite to the light-emitting surface.

However, in this prior art, although the light is reflected by the first white substrate 4 and the second white substrate 2, none is given any consideration as to an inner surface form and the like of the concave 2a, a reflection efficiency was thus not sufficiently improved. In other words, the light-emitting efficiency was still not sufficient.

SUMMARY OF THE INVENTION

Therefore, a primary object of the present invention is to provide a chip-type light-emitting device with case capable of improving a light-emitting efficiency.

The present invention is a chip-type light-emitting device with case, in which an LED chip is bonded onto a substrate formed with electrodes on its surface, and the LED chip on the substrate is surrounded by a case having an inner wall of a hole shaped like a frustum of a cone tapering downward, and a resin which functions as a sealant is filled in the inner wall of the case characterized in that a light outputted from the LED chip is entirely reflected by an inner surface of the sealant by forming a gap between the inner wall and the sealant.

In the chip-type light-emitting device with case, electrodes are formed on a top surface of the substrate, and the LED chip is bonded onto the electrodes. Furthermore, a case having an inner wall of a hole shaped like a frustum of a cone tapering downward surrounds the LED chip, in which a transparent resin as a sealant is filled. When the transparent resin is cured, the transparent resin itself hardens and shrinks, and therefore, a gap is formed between the inner wall and the transparent resin (sealant). In the chip-type light-emitting device with case, since a light outputted from the LED chip is reflected entirely on the inner surface of the sealant, it is possible to efficiently reflect the light outputted from the LED chip.

For example, an impregnation prevention layer is formed on the inner wall of the case, it is thus possible to prevent the transparent resin from impregnating in the case. Due to this, the sealant becomes easily separated from the case at a time the sealant hardens and shrinks. It is thus possible to surely form the gap.

As for the impregnation prevention layer, a relatively thick nickel layer (for example, 5–10 $\mu$m) is used. By forming the nickel layer thickly, a degree of smoothness of the inner wall of the case can be increased, it thus becomes possible to make an outer surface (inner surface) of the sealant even, and therefore, it results in an improved reflection efficiency on the inner surface of the sealant.

The nickel layer is formed on copper or silicon layer by plating.

According to the present invention, the light outputted from the LED chip is entirely reflected on the inner surface of the sealant, it is thus possible to reflect the light efficiently. Therefore, it is possible to improve the light-emitting efficiency.

The above described objects and other objects, features, aspects and advantages of the present invention will become more apparent from the following detailed description of the present invention when taken in conjunction with the accompanying drawings.

BEST FORM FOR PRACTICING THE INVENTION

Figure 1:
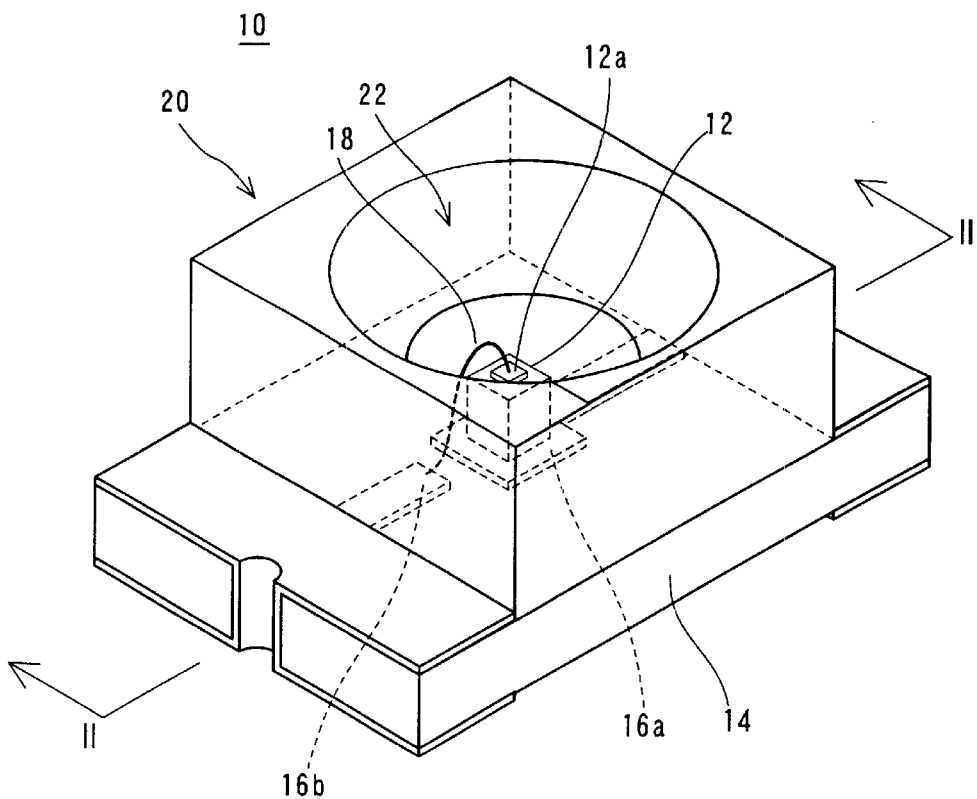
FIG. 1 is an illustrative view showing one embodiment of the present invention.

Referring to FIG. 1, a chip-type light-emitting device with case (hereinafter briefly referred to as "light-emitting device") 10 of this embodiment includes a semiconductor light-emitting element (LED chip) 12, and the LED chip 12 is die-bonded onto an electrode (lead) 16a formed on a surface of a substrate 14 by silver paste, for example. Furthermore, a metal thin wire (bonding wire) 18 such as a gold wire is wire-bonded in order to connect a bonding pad 12a provided on the top of the LED chip 12 to another lead 16b. It is noted that in order to be easily understood, the lead 16a and 16b are represented by adding a thickness; in reality, however, they are formed in a thin film. In addition, the lead 16a and 16b are patterned and formed by a lithography process and an etching process on a surface of the substrate 14. Furthermore, the lead 16a and 16b are electrically insulated from each other, and formed in such a manner as to extend from a one main surface (upper surface) of the substrate 14 to the other side main surface (lower surface) via an approximately center portion (throughhole) of a side surface.

Figure 2:
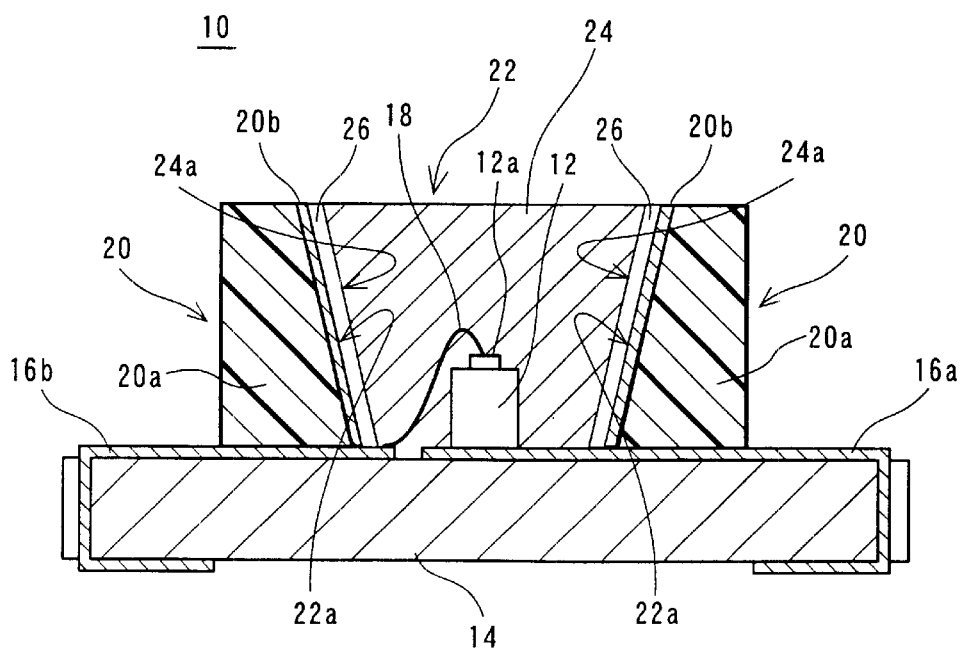
FIG. 2 is a sectional view showing a chip-type light-emitting device with case shown in FIG. 1 embodiment.

In addition, the light-emitting device 10 includes a case 20 formed of, for example a liquid crystal polymer, and the case 20 is disposed on the upper surface of the substrate 14 to surround the LED chip 12. In other words, a hole 22 is formed at an approximately center portion of the case 20. The case 20 also includes, as understood from FIG. 2 which is a II—II sectional view of FIG. 1, a liquid crystal polymer (opaque resin) 20a as described above and an impregnation prevention layer 20b. The hole 22 has an inner wall 22a of a frustum of a cone tapering downward. On the inner wall 22a the impregnation prevention layer 20b is formed. This impregnation prevention layer 20b is a plating layer to prevent a transparent resin 24 described later from impregnating into the case 20. More specifically, the impregnation prevention layer 20b includes a copper (Cu) plating layer and a nickel (Ni) plating layer formed in a laminated manner on the Cu plating layer. Furthermore, in this embodiment, the Cu plating layer is approximately 3 μm in thick, and the Ni plating layer is 5–10 μm in thick. As the Ni plating layer is thus formed relatively thickly, the smoothness of the inner wall 22a of the hole 22 is enhanced.

It is noted that in this embodiment, the Ni plating layer is formed on the Cu plating layer; however, a layer of Si (silicon) may be used instead of the Cu plating layer. This Si layer is formed by a CVD (Chemical Vapor Deposition) method on a surface of the opaque resin 20a.

Within the inner wall 22a of the hole 22 in such the case 20, a transparent resin 24 such as epoxy resin as a sealant is filled. When the transparent resin 24 is cured, a sealant is formed. At this time, the transparent resin 24 itself hardens and shrinks, and therefore, a gap 26 is formed between the inner wall 22a and the transparent resin (sealant) 24. In other words, as the impregnation prevention layer 20b is formed on the inner wall of the case 20, the transparent resin or the sealant 24 is, upon hardening, separated extremely easily from the inner wall 22a. Therefore, the gap 26 is formed between the sealant 24 and the inner wall 22a.

It is noted that according to an experiment by the inventor et al., the gap 26 is formed by 5–10 μm in thick. Furthermore, the transparent resin 24, upon filling in the hole 22 defined by the inner wall 22a, is adhered to the inner wall 22a (Ni plating layer) which has a high smoothness, and therefore, the outer surface (inner surface) 24a of the transparent resin or the sealant 24 is also smoothed. Therefore, it becomes possible to improving the reflection rate.

Figure 3:
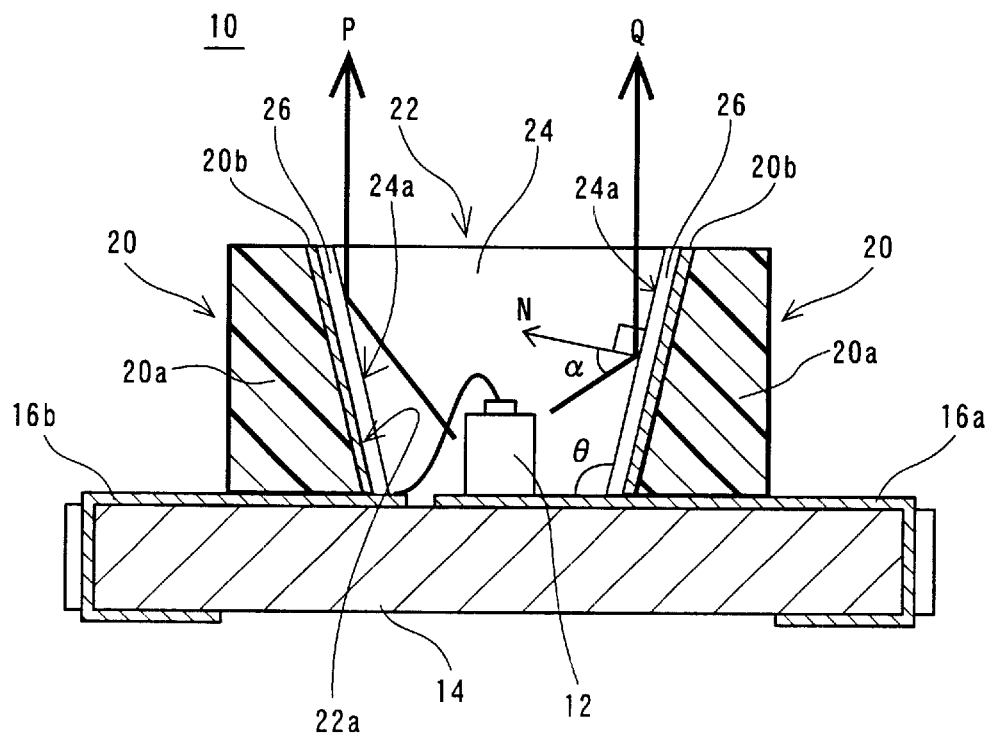
FIG. 3 is a sectional view showing a chip-type light-emitting device with case shown in FIG. 1 embodiment.
Figure 4:
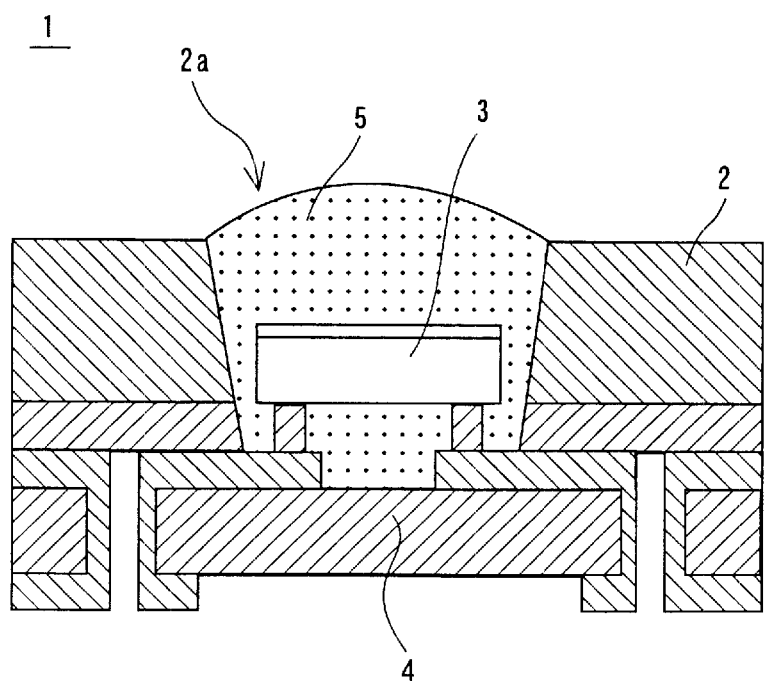
FIG. 4 is a sectional view showing a conventional semiconductor light-emitting device.

The gap 26 is thus formed, as shown in FIG. 3, a light outputted from the LED chip 12 is entirely reflected on the inner surface 24a of the transparent resin or the sealant 24. Due to this, in this example, shown an inclination angle or a tilt angle θ of the inner surface 24a of the sealant 24 or the wall 22a is determined at such an angle as to make an entire reflection of the light outputted from the LED chip 12. More specifically, if the tilt angle θ of the inner surface 24a described by using an optical path Q, when drawing a normal line N against the inner surface 24a, an angle whose acute angle α between the optical path Q and the normal line N is smaller than 40 degrees is determined. It is noted that it may be also possible to determine the tilt angle θ in such a way that "180-θ" degrees is smaller than 50 degrees.

The light entirely reflected, as shown in the optical paths P and Q, is outputted from the light-emitting device 10 approximately vertically toward the upper surface of the substrate 14. In addition, the light not reflected on the inner surface 24a is merely outputted from the light-emitting device 10. Furthermore, in FIG. 3, in order to show the invention more simply, hatching lines of the transparent resin 24 are omitted.

According to this embodiment, a gap is provided between the inner wall of the hole and the sealant, and the light outputted from the LED chip is entirely reflected on the inner surface of the sealant, thus enabling the device to reflect a light efficiently. Therefore, it becomes possible to improve the light-emitting efficiency of such a device and to increase its luminance.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A chip-type light-emitting device with case comprising:
   a substrate formed with electrodes on its surface;
   an LED chip bonded onto said substrate;
   a case having an inner wall shaped like a frustum of a cone tapering downward, and arranged to surround said LED chip on said substrate;
   a sealant resin formed in an area surrounded by said inner wall of said case;
   an impregnation prevention layer formed only on said inner wall to prevent an impregnation of said resin into said case; and
   a gap formed between said impregnation prevention layer and said sealant.

2. A chip-type light-emitting device with case according to claim 1, wherein said impregnation prevention layer includes at least a nickel layer.

3. A chip-type light-emitting device with case according to claim 2, wherein said nickel layer is a plating layer formed on a copper or silicon layer.

* * * * *